United States Patent
Doty

(10) Patent No.: US 7,292,038 B2
(45) Date of Patent: Nov. 6, 2007

(54) DOUBLE-BALANCED DOUBLE-TUNED CP BIRDCAGE WITH SIMILAR FIELD PROFILES

(75) Inventor: F David Doty, Columbia, SC (US)

(73) Assignee: Doty Scientific, Inc., Columbia, SC (US)

( * ) Notice: Subject to any disclaimer, the term of this patent is extended or adjusted under 35 U.S.C. 154(b) by 91 days.

(21) Appl. No.: 11/379,583

(22) Filed: Apr. 21, 2006

(65) Prior Publication Data

US 2006/0244453 A1 Nov. 2, 2006

Related U.S. Application Data

(60) Provisional application No. 60/677,143, filed on May 2, 2005.

(51) Int. Cl.
*G01V 3/00* (2006.01)
(52) U.S. Cl. ...................... 324/318; 324/322
(58) Field of Classification Search .............. 324/318, 324/322, 300
See application file for complete search history.

(56) References Cited

U.S. PATENT DOCUMENTS

| | | | |
|---|---|---|---|
| 4,680,548 A | | 7/1987 | Edelstein |
| 4,916,418 A | * | 4/1990 | Rath ........................ 333/219 |
| 5,202,635 A | * | 4/1993 | Srinivasan et al. ......... 324/322 |
| 5,212,450 A | * | 5/1993 | Murphy-Boesch et al. . 324/322 |
| 5,642,048 A | | 6/1997 | Crozier |
| 5,675,254 A | | 10/1997 | Fiat |
| 6,060,882 A | | 5/2000 | Doty |
| 6,081,120 A | | 6/2000 | Shen |
| 6,100,694 A | | 8/2000 | Wong |
| 6,316,941 B1 | * | 11/2001 | Fujita et al. ................ 324/318 |
| 6,366,093 B1 | | 4/2002 | Hartman |
| 7,119,541 B2 | * | 10/2006 | Barberi ...................... 324/318 |

OTHER PUBLICATIONS

G. Isaac, M. D. Schnall, R. E. Lenkinski, and K. Vogele, "A Design for a Double-Tuned Birdcage Coil for Use in an Integrated MRI/MRS Examination", J. Magn. Reson., 89: 41-50, 1990.

(Continued)

*Primary Examiner*—Louis M. Arana
(74) *Attorney, Agent, or Firm*—Oppedahl Patent Law Firm LLC

(57) ABSTRACT

The MRI rf coil known as the balanced high-pass-weighted hybrid birdcage is modified to obtain two homogeneous degenerate resonances, capable of generating circular polarization at widely separated frequencies, by including inductors in parallel with the ring (high-pass) tuning capacitors such that their isolated parallel resonant frequency is greater than the desired low-frequency (LF) homogeneous resonance and not greater than 10% more than the desired high-frequency (HF) homogeneous resonance. The coil is advantageous for the frequency-diameter product range of 10 to 60 MHz-m. The coil is preferably balanced at both frequencies such that the electric potentials vanish on the central axial plane at both the LF and HF homogeneous modes. Additional parasitic-mode-shifting reactive elements, either capacitors or inductors, may be added between adjacent rungs near their ends, and the rungs may each consist of two parallel bands shorted together at their ends, as in the Crozier birdcage. Note that a high-pass-weighted hybrid birdcage is defined as a hybrid birdcage in which the reactance of the rung series capacitors is significantly less than the reactance of the ring series capacitors.

15 Claims, 4 Drawing Sheets

OTHER PUBLICATIONS

J. R. Fitzsimmons, B. L. Beck, H. R. Brooker, "Double Resonant Quadrature Birdcage", Magn. Reson. in Med., 30:107-114, 1993.

J. T. Vaughan, H. P. Hetherington, J. Otu. , J. W. Pan, and G. M. Pohost, "High Frequency Volume Coils for Clinical NMR Imaging and Spectroscopy," Magn. Reson. in Med., 32:206-218, 1994.

J. Murphy-Boesch, R. Srinivasan, L. Carvajal, and T. R. Brown, "Two Configurations of the Four-Ring Birdcage for 1H Imaging and 1H-Decoupled 31P Spectroscopy of the Human Head," J. Magn. Reson. Ser. B, 103:103-14, 1994.

G. X. Shen, J. F. Wu, F. E. Boada, K. R. Thulborn, ". . . Dual-Tuned, Low-Pass Birdcage . . . for MRI and MRS of Human Brain at 3.0 Tesla", Magn. Reson. Med., 41:268-275, 1999.

G. B. Matson, P. Vermathen, and T. C. Hill, "A Practical Double-Tuned 1H/31P Quadrature Bird-cage Headcoil Optimized for 31P Operation," J. Magn. Reson., 139:81-89, 1999.

W. H. Wong and S. Sukumar, "Multiple-Tuned Millipede Coil for high-field Imaging Applications," presented at ISMRM, Hawaii, 2002.

F. David Doty, George Entzminger, C. Hauck, and John P. Staab, "Practical Aspects of Bird-cage Coils," J. Magn. Reson., 138:144-154, 1999.

L. Golman, J.H. Ardenkjaer-Larsen, J. S. Petersson, S. Mansson, and I. Leunback "Molecular Imaging with Endogenous Substances", PNAS, http://www.pnas.org/cgi/reprint/100/18/10435?ck=nck , 2003.

J. Kulkarni, N. Laws, J. P. Staab, G. Entzminger, J. A. Goodman, J. R. Garbow, and F. D. Doty, "A 500 MHz, 11 cm Hybrid Birdcage with Improved Tuning Range", Presented at the 13th ISMRM, Miami, 2005.

* cited by examiner

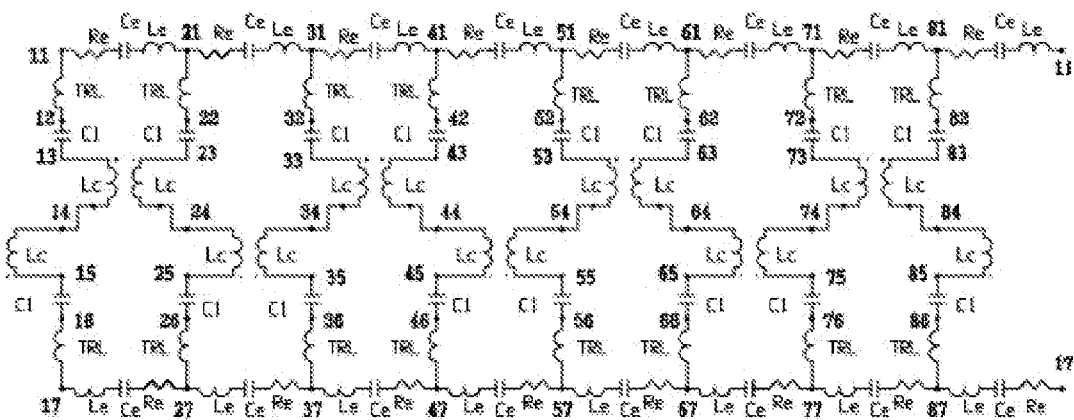
Figure 1 – Prior art
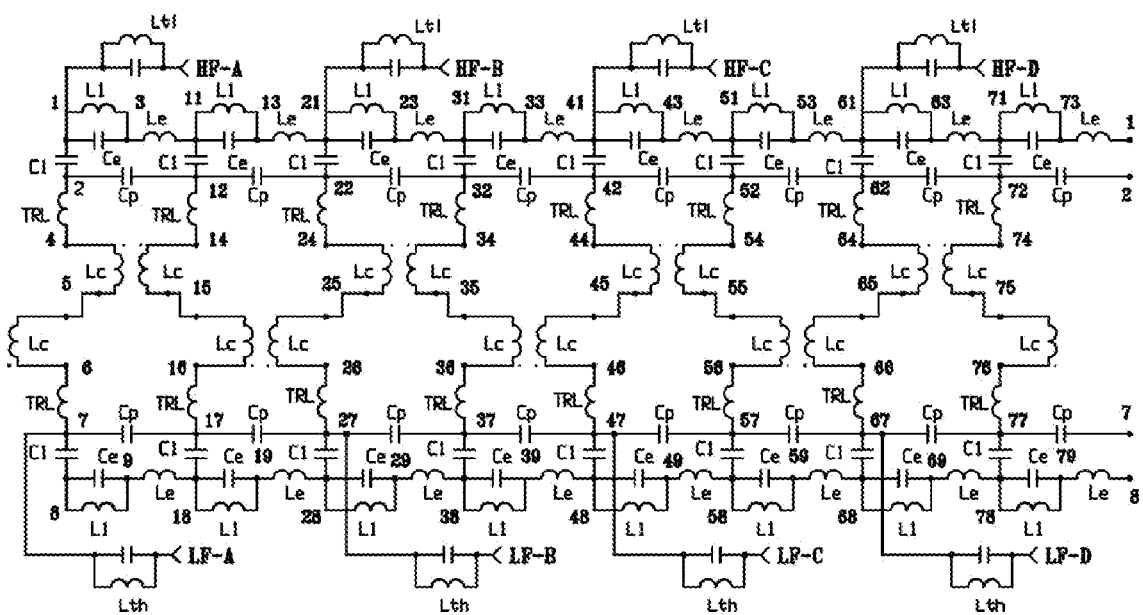
Figure 2

DOUBLE-BALANCED DOUBLE-TUNED CP BIRDCAGE WITH SIMILAR FIELD PROFILES

FIELD OF THE INVENTION

The field of this invention is MRI RF coils, and, more particularly, a double-resonance circular-polarization homogeneous volume rf coil for large samples at high fields.

BACKGROUND OF THE INVENTION

This invention pertains to improving the performance of double-resonance circular-polarization (CP) homogeneous rf resonators for magnetic resonance imaging (MRI), for use especially where the frequency-diameter (fd) product is greater than 10 MHz-m and at least up to 60 MHz-m, possibly higher. It is related to hybrid birdcage (BC) coils, as disclosed by Edelstein et al in U.S. Pat. No. 4,680,548, and Crozier's 8-section variant, U.S. Pat. No. 5,642,048.

As is well known, the simple lumped-element models of the birdcage as disclosed initially by Edelstein and Hayes are of limited value in predicting tuning value components and mode frequencies except at rather low fd products—generally below about 15 MHz-m. The circuit model shown in FIG. 1 for the 8-section hybrid case, is perhaps the best simple model for use in commonly available linear circuit simulation software for the hybrid birdcage, also known as the band-pass birdcage. There, circuit nodes are identified as needed to define the model, and each axial inductive element is represented by the series combination of a mutual inductance $L_C$ to each adjacent rung with a transmission line (TRL) at each end. The initial model parameters of the TRLs (length, impedance, propagation velocity, and attenuation coefficient) are estimated by standard approximations from the physical dimensions of the coil. Then, mutual inductive couplings to adjacent rungs are estimated for the lumped couplings, and the lengths of the TRLs in the model are shortened appropriately. The characteristic impedance and propagation velocity are reduced somewhat, and the attenuation coefficient is increased, as discussed by Doty et al, *JMR*, 138:144-154, 1999. The 8-section model shown is easily extended to 12, 16 or higher numbers of sections. Note that the right-most ring inductive elements connect back to nodes 11 and 17 respectively.

For $C_E$ substantially larger than $C_1$, the hybrid coil is essentially the balanced low pass (LP) birdcage, and the lowest mode frequency, m1, supports homogeneous circular polarization. The LP BC is seldom selected for fd above 15 MHz-m, as the tuning becomes strongly sample dependent because of its relatively high conservative electric fields.

For $C_1$ well over an order of magnitude larger than $C_E$, the hybrid coil approximates the balanced high pass (HP) birdcage, and the highest (or possibly next to highest, if an end-ring mode is present) mode frequency, also called m1, supports homogenous circular polarization. Here, both the usable fd range and the homogeneity are improved by increasing the number of rung elements, and frequently 16 are used, though another option is to use two parallel bands per axial inductive element, as in the Crozier coil, for extended range and improved homogeneity for a given number of sections. In this case, 8 sections are generally sufficient for fd up to 50 MHz-m, especially if an insulated cross-over is added in each rung section, as disclosed by Doty in U.S. Pat. No. 6,060,882.

When $C_E$ is less than an order of magnitude larger than $C_1$ but not much less than $C_1$, the coil becomes the hybrid birdcage, with a more complex and closely spaced mode structure; and for that reason it has seldom been used, even though it can in principle extend the BC to somewhat higher fd products. However, for fd above 45 MHz-m, the circuit model is of limited accuracy (even with minor improvements, such as appropriate parasitic stray capacitances at the various nodes), and full-wave finite element software or trial and error is required to tune the coil. With some state-of-the-art full-wave software, the homogeneous and adjacent modes and field strengths may be predicted to within a few percent. This permits the high-pass-weighted hybrid BC (in which $C_1$ is typically 5 to 30 times $C_E$) to be a practical method of extending the range of the BC to higher fd products, as shown recently by Doty et al in a poster presentation, "An 11 cm, 500 MHz Hybrid Birdcage with Improved Tuning Range", at the 13th ISMRM, 2005, in Miami. Some advantage may also sometimes be obtained if the LP capacitors ($C_1$) are located at an intermediate position in the TRLs, according to the prior art, rather than at their ends.

Double-resonance techniques in MRI comprise but a small fraction of a percent of current MRI applications, primarily because MRI is usually interested in maximum resolution, which requires high signal to noise (S/N) and the S/N of protons usually exceeds that of the other available nuclides by more than an order of magnitude. The additional information available from spatially localized spectroscopy of nuclides other than $^1H$ has driven most of the double-resonance MRI applications thus far, but these applications have been limited.

Recently, it has been shown that $^{13}C$ may be hyperpolarized via novel dynamic nuclear polarization (DNP) methods which permit its S/N to be increased by up to four orders of magnitude (see, for example, Golman et al, PNAS, 2003). Moreover, this polarization may be transferred to other nuclides (including $^1H$) for dramatic increases in the S/N of other nuclides. Hence, it seems that DNP will stimulate strong growth in the applications of double-resonance MRI in large samples at high fields.

Most prior art double resonance MRI experiments for the fd range of 4-20 MHz-m have utilized orthogonal linear-polarization (LP) litz coils, as disclosed in U.S. Pat. No. 6,060,882. The lower end of the above fd range will continue to be best addressed by such coils, owing to their advantages in manufacturability, homogeneity, and S/N for this range, where sample losses are not strongly dominant. However, for fd above 20 MH-m for smaller coils, or above 10 MHz-m for larger coils, sample losses become strongly dominant relative to coil and capacitors losses, and rf eddy currents or dielectric resonance effects within the sample begin to seriously affect rf field homogeneity. Under these conditions, CP rf coils are preferable. Moreover, obtaining clean, homogeneous modes in double resonance MRI using orthogonal linear litz coils at fd above 15 MHz-m has been technically problematic.

Isaac et al (*JMR*, 89:41-50, 1990) presented a method of double-tuning the unbalanced LP BC by inserting an HF tank (trap) into each rung. This coil generates rather closely matched field profiles at the two frequencies, as it behaves essentially as an unbalanced LP BC at both the LF and the HF. However, it has excessive sample losses and poor S/N for HF fd greater than 10 MHz-m.

Fitzsimmons et al (*MRM*, 30:107-114, 1993) describe the use of an unbalanced LP BC for the LF inside a balanced HP BC for the HF. Here, the LF is still effectively limited to ~10 MHz-m (for example, $^{31}P$ up to 2 T for the human head), and the couplings between the coils make tuning extremely challenging. They partially address this latter issue by making the outer HP coil significantly longer and larger in diameter than the inner coil, which results in excessive HF ROI (region of interest) and sample heating. The field profiles of these separate coils are very poorly matched.

Vaughan et al (*MRM,* 32:206-218, 1994) have demonstrated the use of the TEM (transverse electro-magnetic) resonator for double resonance at HF fd up to 45 MHz-m. While this resonator is in principle capable of generating CP fields with matched field profiles, the technical challenges are daunting, arising from the nature of its closely spaced mode structure, which follows from the use of weakly coupled resonator elements. Consequently, the double-tuned TEM resonator has not been commercially successful.

Murphy-Boesch et al (*JMR B* 103:103-14, 1994) describe several 4-ring birdcages, including an LP-LP and an LP-HP, for the generation of CP fields at two separate frequencies. A similar approach was taken by Varian with their DT "millipede" coil, introduced commercially in 1999. The primary problem with 4-ring structures is that they generate strong, inhomogeneous rf fields within the sample outside the ROI—a manifestation of their absence of field profile matching. As a result, there is excessive sample heating and poor S/N. Another problem with 4-ring structures is that they have a large number of closely spaced parasitic inhomogeneous modes, which severely complicates tuning and renders simple circuit models essentially useless.

Shen et al (*MRM,* 41:268-275, 1999) improve upon Isaac's double-tuned (DT) LP BC and maintain rather well matched field profiles at the two frequencies (except near the traps). They show it can be used for fd up to 32 MHz-m and the tuning component values can be calculated quite accurately. Still, the topology is unbalanced LP at both frequencies and S/N is poor at the HF.

Matson et al (*JMR,* 139:81-89, 1999) describe a BC analogy to Vaughan's TEM coil, in which alternate rungs are tuned to two different frequencies in a balanced LP configuration. They achieve remarkable S/N at the LF in a 1.5 T head coil; but, as the topology is LP, the HF performance is poor. Also, since only 8 rungs are used for each frequency, $B_1$ homogeneity suffers at both frequencies.

Fiat describes a DT coil tuning approach in U.S. Pat. No. 5,675,254 for linear coils that had been in wide-spread usage in commercial MRI and NMR coils since the mid-1980's. Shen suggests the use of multi-layer structures and electronic switches for multi-resonant NMR or MRI in U.S. Pat. No. 6,081,120. Hartman, in U.S. Pat. No. 6,366,093, discloses novel re-entrant cavities capable of generating linear rf magnetic fields of high homogeneity at one or two frequencies simultaneously with essentially equal field profiles for a narrow range of suitable conditions with respect to fd product and available space.

In summary, prior-art DT CP coil designs for large samples at high frequencies have generally exhibited some combination of (a) increased high-frequency (HF) sample losses, (b) degraded $B_1$ homogeneity at one or both frequencies, (c) increased low-frequency (LF) coil losses, (d) widely differing rf magnetic field profiles at the two frequencies, or (e) severe tune-up and matching challenges. The novel coil in this invention addresses these issues and has improved homogeneity, sensitivity, channel isolation, symmetry, tunability, and manufacturability compared to the prior art.

The preferred, novel DT CP rf head coil disclosed herein behaves as a low pass (LP) birdcage at the LF and a high pass (HP) birdcage at the HF. It efficiently generates uniform circular polarization (CP) at both frequencies. It is advantageous for DT human head coils in which the HF is $^1$H from 1 T at least up to 4.7 T and probably higher. The improvements in this invention are achieved from the novel topology that, among other characteristics, results in two homogeneous modes, widely separated in frequency, with similar spatial profiles of the rf magnetic fields, both within the homogeneous region and beyond. At both the HF and the LF homogeneous modes, the rf magnetic field profiles are very similar to those of CP birdcages at similar frequencies. The coil is electrically balanced such that the electric potentials vanish on the central axial plane at both the LF and HF homogeneous modes.

SUMMARY OF THE INVENTION

The MRI rf coil known as the balanced high-pass-weighted hybrid birdcage is modified to obtain two homogeneous degenerate resonances, capable of generating circular polarization at widely separated frequencies, by including inductors in parallel with the ring (high-pass) tuning capacitors such that their isolated parallel resonant frequency is greater than the desired low-frequency (LF) homogeneous resonance and not greater than 10% more than the desired high-frequency (HF) homogeneous resonance. The coil is advantageous for the frequency-diameter product range of 10 to 60 MHz-m. The coil is preferably balanced at both frequencies such that the electric potentials vanish on the central axial plane at both the LF and HF homogeneous modes. Additional parasitic-mode-shifting reactive elements, either capacitors or inductors, may be added between adjacent rungs near their ends, and the rungs may each consist of two parallel bands shorted together at their ends, as in the Crozier birdcage. Note that a high-pass-weighted hybrid birdcage is defined as a hybrid birdcage in which the reactance of the rung series capacitors is significantly less than the reactance of the ring series capacitors.

BRIEF DESCRIPTION OF THE DRAWINGS

FIG. 1 is a circuit model of the 8-section hybrid birdcage coil according to the prior art.

FIG. 2 is a practical circuit model of the 8-section DBDT CP BC coil.

DETAILED DESCRIPTION OF THE PREFERRED EMBODIMENTS

Figure 3:
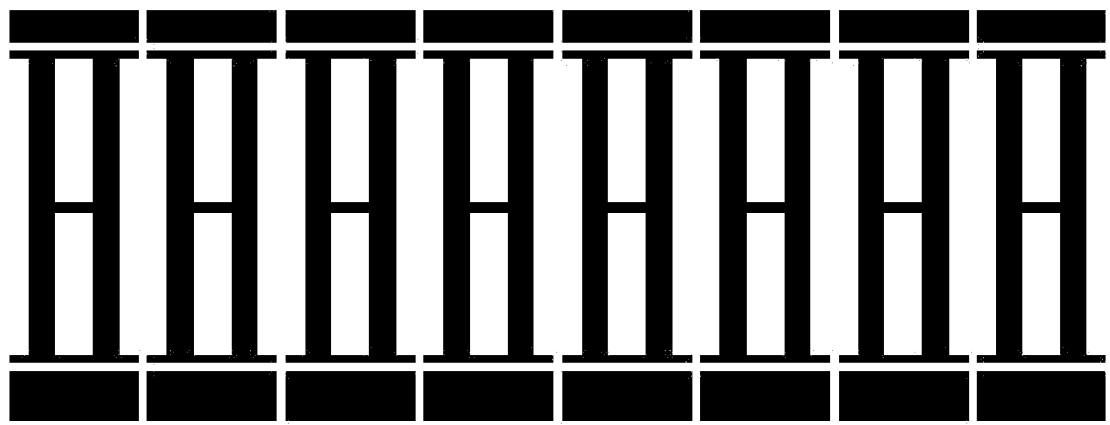
FIG. 3 is an 8-section DBDT BC foil pattern laid out flat.

FIG. 2 depicts the inventive circuit in which the HF is generated by a balanced HP BC, as preferred for maximum fd, and the LF is generated by the same rung elements operating as a balanced LP BC. These characteristics are essential to insure that coil achieves similar rf magnetic field profiles at the two homogeneous frequencies with the best possible performance at the highest fd products.

Operation is understood in general terms most easily by first assuming the capacitors $C_P$ are not needed and ignoring the HF traps, $L_{TH}$, and the LF traps, $L_{TL}$. A small-value, high-Q inductance $L_1$ is placed in parallel with each ring capacitance $C_E$ to form a ring trap with isolated resonance (resonance when disconnected from the rest of the circuit) generally a little below the desired HF frequency $f_H$ but at least greater than 0.5 $f_H$. Then, at the LF, the ring trap appears as a small additional inductance in series with $L_E$, and at the HF it appears as a small capacitor. Hence, at the LF, the ladder network looks like a balanced LP BC, with LF feeds, for example, at LF-A, LF-B, LF-C, and LF-D, having relative phases of 0°, 90°, 180°, and 270°. And at the HF, the ladder network looks like a balanced HP BC, with HF feeds, for example, at HF-A, HF-B, HF-C, and HF-D, having relative phases of 0°, 90°, 180°, and 270°. Hence, assuming the LF and HF are widely separated and the number of sections is at least 8, the reactance of the ring traps at $f_H$, normally the proton resonant frequency, will be large compared to that of $C_1$ at $f_H$.

Note that because there may be significant stray capacitance in the structure in parallel with $C_E$, in some cases the isolated resonance of the ring trap could be up to $1.1f_H$.

While standard two-point quadrature drive may be used at the LF, for example at LF-A and LF-B, coil symmetry, in particular at the LF, is improved from the use of a four-point matching network, according to the prior art. One attribute of the DBDT coil of FIG. 2 is that substantial LF and HF voltages are present at all available feed points. Hence, traps are required, as shown, on all feed lines. The LF feed lines driving the LF feed points require series HF isolation traps ($L_{TH}$ and its parallel capacitor), and the feed lines driving the HF feed points require LF isolation traps ($L_{TL}$ and its parallel capacitor). Moreover, these traps must have high Q to avoid degrading performance of their respective frequencies. The LF isolation traps are less critical, as a small capacitance may be used to match to the HF, which would have high reactance at the LF. Other standard coupling arrangements could also be used.

For fd above 25 MHz-m, it is not difficult to achieve high HF efficiencies—i.e., very low losses in the circuit components relative to the losses in the sample. This is mostly because the sample losses increase quickly with frequency, but also because the parallel resistance of the ring trap at the HF is easily made quite large compared to its reactance. Minimizing the relative ring trap losses at the LF is more of a challenge, largely because the sample losses are lower, but also because it is difficult to achieve very low series resistance in the ring trap inductance. Partly for this reason, but perhaps mostly for manufacturing simplifications, there is a strong incentive to use the minimum practical number of sections, which in general is eight, as illustrated in FIG. 2 and in subsequent figures.

Because there are two significant inductances, $L_1$ and $L_E$, and two significant capacitances, $C_E$ and stray (not shown), in each ring section as well as distributed rung coupling, the mode structure is not as simple as the above discussion implies, especially for more than 4 sections. In the 8-section case, a parasitic inhomogeneous mode will generally be present relatively near $f_H$ and often close enough to adversely affect homogeneity and efficiency of the desired HF resonance. This inhomogeneous mode is characterized by an m=2 voltage pattern and thus is most conveniently shifted relative to the homogeneous HF mode by addition of a reactive element between adjacent rung ends. A relatively small capacitor, $C_P$, may be used to shift the parasitic mode downward relative to $f_H$. Alternatively, a relatively large inductor may be used here to shift the parasitic mode upward. In either case, the magnitude of the reactance of the element designated as $C_P$ is generally at least twice that of $C_E$ at the HF.

FIG. 3 shows the copper foil pattern laid out flat for an 8-section DBDT coil. Here, one sees two parallel copper bands 31, 32 for each rung element, as first used by Crozier in an HP BC, as this reduces stray capacitance without significantly increasing rung inductance or resistance and thus permits operation at higher fd for a given number of sections. Note that the axial inductive element comprised of the two parallel bands 31, 32 is represented in FIG. 2 as the series combination of two TRLs and two mutual inductances, as, for example, the circuit elements between nodes 2 and 7. At least for fd up to 40 MHz-m, an insulated cross-over at the center between the two parallel bands, as disclosed in U.S. Pat. No. 6,060,882, is of further benefit in improving rf field homogeneity, though it makes it much more time consuming to achieve the precision in the full-wave simulations needed for accurate tune-up, owing to the fine mesh elements needed at the cross-over. A short 33 between the two bands near the center may be useful in suppressing an inhomogeneous mode that sometimes appears for fd above 40 MHz-m.

Figure 4:
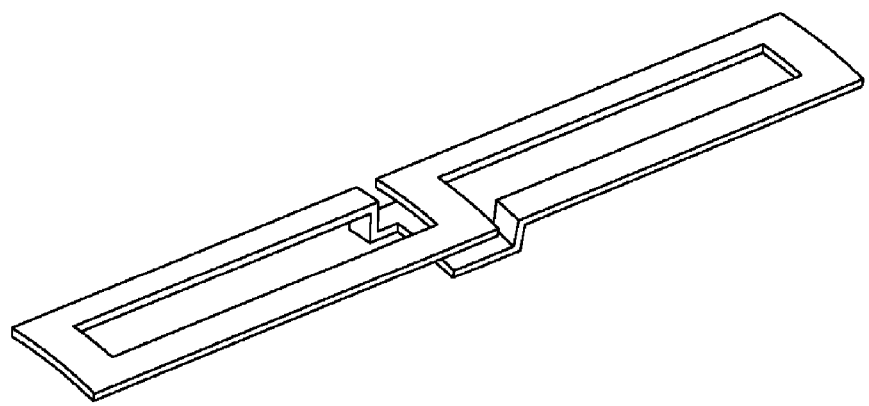
FIG. 4 illustrates in perspective view an insulated central crossover.

FIG. 4 illustrates in perspective view a rung section containing an insulated crossover 34 between adjacent inductive subroutes at the center.

Figure 5:
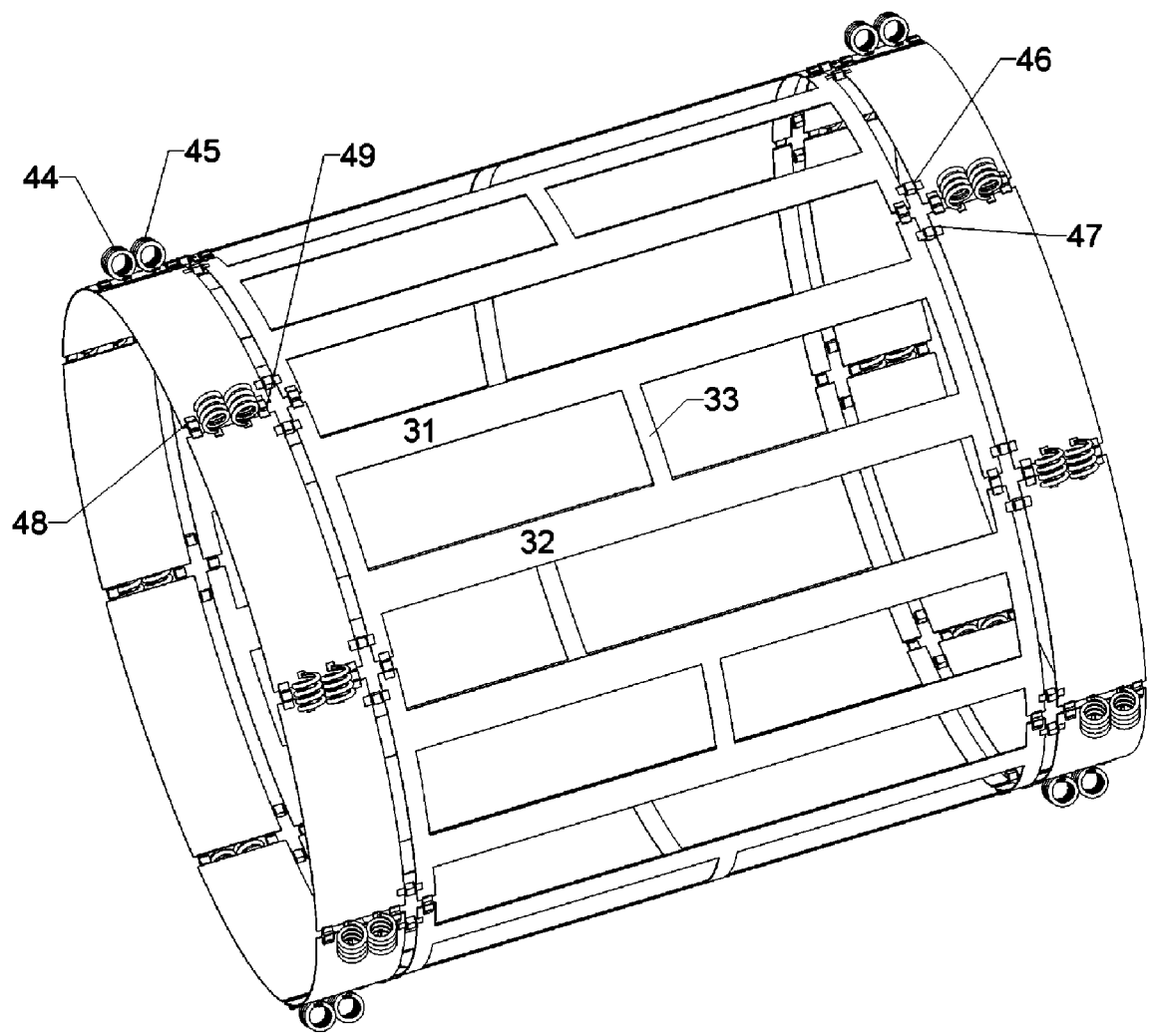
FIG. 5 is a perspective view of an unshielded 8-section DBDT BC coil.

FIG. 5 gives a perspective view of the 8-section DBDT coil without the external shield or coupling networks. As noted earlier, $L_1$ is of small value, at most four times $L_E$ and typically about twice $L_E$, which is generally as small as practical—usually under 20 nH. But if $L_T$ is too small, it may become more difficult to shift the parasitic mode sufficiently away from the HF. Because of the practical difficulties of making low-inductance inductors of very high Q, it is advantageous to use two parallel inductors 44, 45 of twice the desired inductance for $L_1$, as seen in FIG. 5. Each ring trap inductor is of heavy copper wire and of relatively large diameter for high Q. For further reductions in coil and capacitor losses, it is preferably to use two axially spaced capacitors 46, 47 of half the desired capacitance for $C_E$. And it is preferable to use two azimuthally spaced capacitors 48, 49 of half the desired capacitance for $C_1$.

A further clarification is needed on the distinction between two-ring and four-ring birdcages, as it may appear that the structure shown in FIG. 5, based on that of FIG. 3, is a four-ring birdcage. However, as was noted earlier, the reactance of $C_P$ is generally at least twice that of $C_E$. Moreover, the spacing between the $C_P$ trace and the end ring on which the $L_1/C_E$ tanks are mounted is a minimum practical spacing—in part to maintain matched field profiles at the two frequencies. So the energy in the fields between the end ring and the $C_P$ trace is negligible at both frequencies. In four-ring BCs on the other hand, as previously disclosed by Murphy-Boesch and others, the adjacent rings at each end are well spaced, and the magnetic fields between the adjacent rings are substantial and play an integral role in establishing the resonant frequencies.

It should be noted that at high fd products, such as for a 3 T head coil, there will be significant differences between the rf fields at the two frequencies because of dielectric resonance effects even though the rung current distributions are essentially identical for both frequencies. However, the field matching is about as good as is practical under such conditions, and S/N may be nearly ideal at both frequencies.

Figure 6:
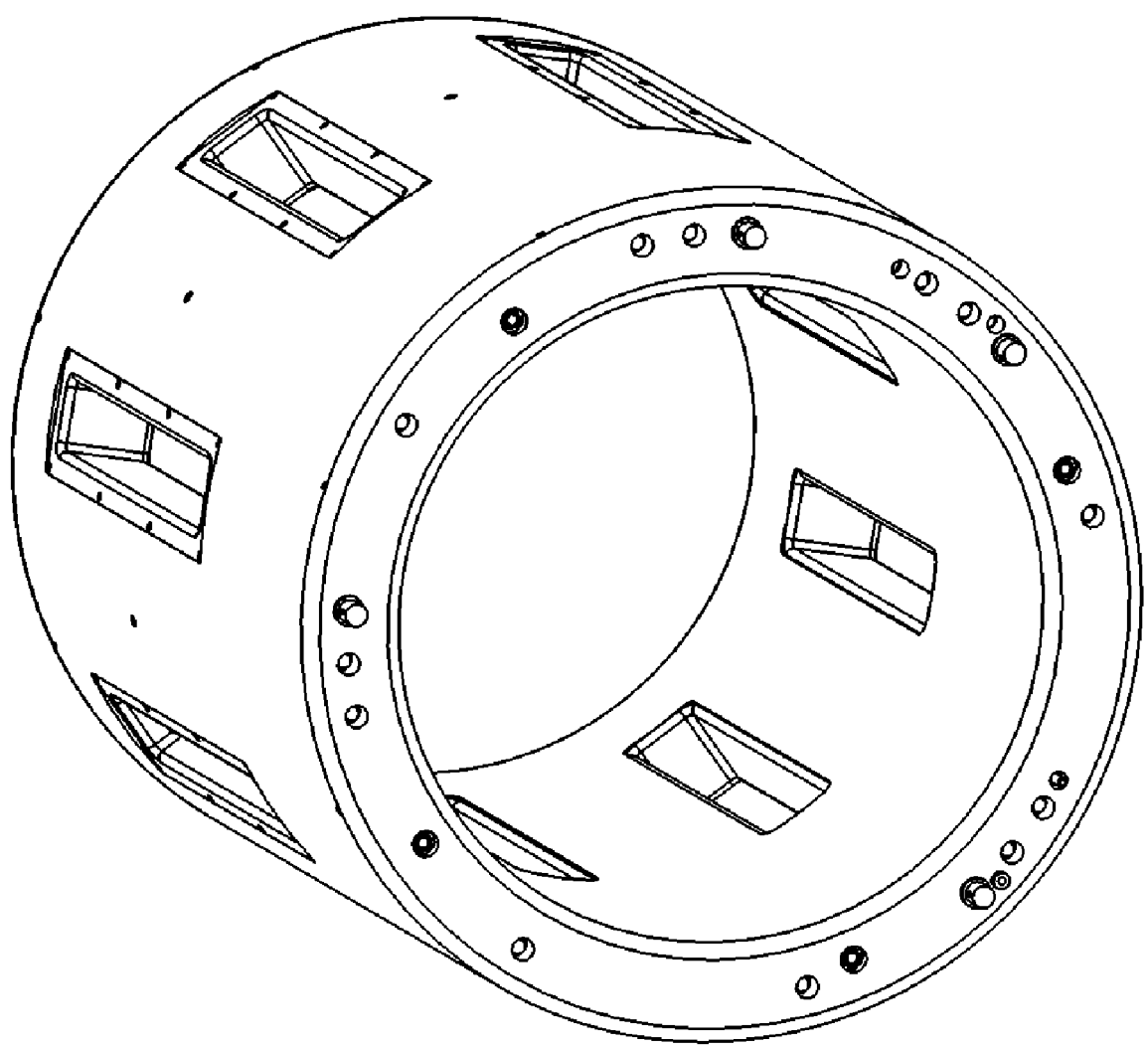
FIG. 6 is a perspective view of a shielded 8-section DBDT BC with access windows.

FIG. 6 is a perspective view of an 8-section DBDT BC with enclosure and external rf shielding, which is generally required for sufficiently stable tuning and reduced radiation losses at the HF. The 8-section coil leaves sufficient space between sections for useful access windows, as shown.

It will thus be appreciated that one embodiment of the invention is an MRI RF double-balanced double-tuned (DBDT) coil comprising 4n substantially identical adjacent ladder sections, where n is a small integer, on a substantially cylindrical dielectric coilform of diameter $d_F$, for use in polarizing field $B_0$. In the figures, n is 2, but n up to 4 or 5 may be justified in some special cases. The DBDT coil is further characterized as including means for orthogonal coupling at a lower frequency $f_L$ and a higher frequency $f_H$. The ladder section is further characterized as comprising serially connected ring sections at each end and rung sections axially there between. The rung sections are further characterized as each comprising an axial inductive element having opposite rung ends and a rung capacitance $C_1$ series connected to each rung end. The ring sections are further characterized as each comprising a ring inductive element $L_E$ and a ring trap. The rung capacitance $C_1$ is further series connected to an adjacent ring inductive element. The ring trap comprises the parallel combination of a ring capacitance $C_E$ and a ring trap inductance $L_1$. The ring trap is further characterized as providing interconnection between adjacent ring inductive elements, The $C_E$ and the $L_1$ are further characterized as having reactances of equal magnitudes at a frequency denoted as the ring-trap isolated resonant frequency $f_T$, where said $f_T$ is greater than $0.5 f_H$ but less than $1.1 f_H$. Optionally $L_1$ may be less than four times $L_E$. Optionally $C_1$ has a magnitude of reactance at $f_H$ that is small compared to that of said ring trap at $f_H$. Optionally there may be a reactive mode-shifting element connected between adjacent rung ends, said mode-shifting element having a magnitude of reactance greater than twice that of $C_E$ at $f_H$. Optionally the axial inductive element may comprises two azimuthally spaced inductive subroutes in parallel. Optionally the DBDT coil may include an external cylindrical rf shield. Optionally $f_H$ may be the $1_H$ resonant frequency in said $B_0$. Optionally $C_1$ may be a plurality of azimuthally spaced capacitors in parallel. Optionally $L_1$ may be a plurality of axially spaced trap inductors in parallel. Optionally $C_E$ is further characterized as comprising a plurality of axially spaced capacitors in parallel. Optionally the means for orthogonal coupling at a lower frequency includes a series isolation trap tuned to $f_H$. Optionally the subroutes are foil strips with an insulated cross-over at the axial center of said axial inductive element. Optionally the DBDT coil may including access windows through said rf shield between said rung sections. Optionally the trap inductor may be a solenoid of diameter greater than $0.04 d_F$ and made of wire of diameter greater than $0.005 d_F$.

It will be appreciated that although the invention is described with respect to particular embodiments, the invention itself is not so limited, and those skilled in the art will have no difficulty whatsoever in devising myriad obvious variants and improvements, all of which are intended to be encompassed within the claims which follow.

I claim:

1. An MRI RF double-balanced double-tuned (DBDT) coil comprising 4n substantially identical adjacent ladder sections, where n is a small integer, on a substantially cylindrical dielectric coilform of diameter $d_F$, for use in polarizing field $B_0$, said DBDT coil further characterized as including means for orthogonal coupling at a lower frequency $f_L$ and a higher frequency $f_H$, said ladder section further characterized as comprising serially connected ring sections at each end and rung sections axially there between, said rung sections further characterized as each comprising an axial inductive element having opposite rung ends and a rung capacitance $C_1$ series connected to each rung end, said ring sections further characterized as each comprising a ring inductive element $L_E$ and a ring trap, said $C_1$ further series connected to an adjacent ring inductive element, said ring trap comprising the parallel combination of a ring capacitance $C_E$ and a ring trap inductance $L_1$, said ring trap further characterized as providing interconnection between adjacent ring inductive elements, said $C_E$ and said $L_1$ further characterized as having reactances of equal magnitudes at a frequency denoted as the ring-trap isolated resonant frequency $f_T$, where said $f_T$ is greater than $0.5 f_H$ but less than $1.1 f_H$.

2. The DBDT coil of claim 1 in which said $L_1$ is further characterized as being less than four times $L_E$.

3. The DBDT coil of claim 1 in which said $C_1$ is further characterized as having magnitude of reactance at $f_H$ that is small compared to that of said ring trap at $f_H$.

4. The DBDT coil of claim 1 further characterized as including a reactive mode-shifting element connected between adjacent rung ends, said mode-shifting element further characterized as having magnitude of reactance greater than twice that of $C_E$ at $f_H$.

5. The DBDT coil of claim 1 in which n equals 2.

6. The DBDT coil of claim 1 in which said axial inductive element comprises two azimuthally spaced inductive subroutes in parallel.

7. The DBDT coil of claim 1 further characterized as including an external cylindrical rf shield.

8. The DBDT coil of claim 1 in which $f_H$ is further characterized as being the $^1H$ resonant frequency in said $B_0$.

9. The DBDT coil of claim 1 in which said $C_1$ is further characterized as comprising a plurality of azimuthally spaced capacitors in parallel.

10. The DBDT coil of claim 1 in which said $L_1$ is further characterized as comprising a plurality of axially spaced trap inductors in parallel.

11. The DBDT coil of claim 1 in which said $C_E$ is further characterized as comprising a plurality of axially spaced capacitors in parallel.

12. The DBDT coil of claim 1 in which said means for orthogonal coupling at a lower frequency includes a series isolation trap tuned to $f_H$.

13. The DBDT coil of claim 6 in which said subroutes comprise foil strips with an insulated cross-over at the axial center of said axial inductive element.

14. The DBDT coil of claim 7 further characterized as including access windows through said rf shield between said rung sections.

15. The DBDT coil of claim 10 in which said trap inductor is a solenoid of diameter greater than $0.04\ d_F$ and made of wire of diameter greater than $0.005\ d_F$.

* * * * *